United States Patent [19]

Heflinger

[11] Patent Number: 5,440,230
[45] Date of Patent: Aug. 8, 1995

[54] COMBINATORIAL SIGNATURE FOR COMPONENT IDENTIFICATION

[76] Inventor: Bruce L. Heflinger, 2481 Richard Ct., Mountain View, Calif. 94043

[21] Appl. No.: 42,297

[22] Filed: Apr. 2, 1993

[51] Int. Cl.⁶ .............................................. G01R 27/02
[52] U.S. Cl. .................................. 324/158.1; 324/73.1
[58] Field of Search ........... 324/158 R, 158 D, 158 T, 324/73.1, 537, 750, 754, 765, 158.1; 371/15.1, 22.4, 22.3

[56] References Cited

U.S. PATENT DOCUMENTS

| | | | |
|---|---|---|---|
| 4,074,189 | 2/1978 | Harms et al. | 324/158 R |
| 4,183,460 | 1/1980 | Yuen et al. | 371/22.4 |
| 4,380,070 | 4/1983 | Steiner | 371/20 |
| 4,760,330 | 7/1988 | Lias, Jr. | 371/15.1 |
| 4,768,195 | 8/1988 | Stoner et al. | 324/73.1 |
| 4,785,235 | 11/1988 | Hendricks et al. | 324/537 |
| 4,942,358 | 7/1990 | Davis et al. | 324/158 R |
| 5,003,251 | 3/1991 | Fuoco | 324/158 F |
| 5,103,166 | 4/1992 | Jeon et al. | 324/158 R |
| 5,162,975 | 11/1992 | Matta et al. | 439/73 |
| 5,289,113 | 2/1994 | Meaney et al. | 324/158 R |

OTHER PUBLICATIONS

Nijenhuis, A. et al., Combinatorial Algorithms, 1975, pp. 81–86, Academic Press, Inc.
Fay, T. R. et al.,(The complete Journal is included containing several articles with differedt titles), pp. 1–36, Hewlett-Packard Journal, Oct. 1984, vol. 35, No. 10.

Primary Examiner—Vinh Nguyen

[57] ABSTRACT

A method for packaging and identifying integrated circuits. The method includes providing integrated circuit packages each having a respective set of identifying electrical nodes coupled thereto. For each of the packages, a respective one of the integrated circuits is mounted therein. For each of the packages, members of the respective set of electrical nodes are electrically interconnected in a manner associated with a respective identity of the respective integrated circuit mounted therein.

For each of the packages, members of the respective set of electrical nodes are electrically interconnected in a manner associated with a respective identity of the respective integrated circuit mounted therein. For each of the packages, electrical signals are applied to members of the respective set of nodes. The integrated circuits are efficiently and reliably identified by sensing the electrical signals conducted between electrically interconnected members of the respective set of nodes.

12 Claims, 8 Drawing Sheets

| GROUPING OF 3 NODES | INTERCONNECTION OF NODES |
|---|---|
| ( (1, 2, 3) ) | ①—②—③ |
| ( (1, 2), (3) ) | ①—② ③ |
| ( (1, 3), (2) ) | ①—﹈②﹉③ |
| ( (1), (2, 3) ) | ① ②—③ |
| ( (1), (2), (3) ) | ① ② ③ |

FIG. 6

| GROUPING OF 4 NODES | INTERCONNECTION OF NODES |
|---|---|
| ( (1, 2, 3, 4) ) | ①  ②  ③  ④ |
| ( (1, 2, 3), (4) ) | ①—②—③  ④ |
| ( (1, 2, 4), (3) ) | ①—②  ③  ④ (1-2, 2-4) |
| ( (1, 2), (3, 4) ) | ①—②  ③—④ |
| ( (1, 2), (3), (4) ) | ①—②  ③  ④ |
| ( (1, 3, 4), (2) ) | ①  ②  ③—④ (1-3, 3-4) |
| ( (1, 3), (2, 4) ) | ①  ②  ③  ④ (1-3, 2-4) |
| ( (1, 3), (2), (4) ) | ①  ②  ③  ④ (1-3) |
| ( (1, 4), (2, 3) ) | ①  ②—③  ④ (1-4) |
| ( (1), (2, 3, 4) ) | ①  ②—③—④ |
| ( (1), (2, 3), (4) ) | ①  ②—③  ④ |
| ( (1, 4), (2), (3) ) | ①  ②  ③  ④ (1-4) |
| ( (1), (2, 4), (3) ) | ①  ②  ③  ④ (2-4) |
| ( (1), (2), (3, 4) ) | ①  ②  ③—④ |
| ( (1), (2), (3), (4) ) | ①  ②  ③  ④ |

FIG. 7

COMBINATORIAL SIGNATURE FOR COMPONENT IDENTIFICATION

BACKGROUND OF THE INVENTION

The present invention is generally directed to integrated circuit packaging and more particularly to a method for packaging and identifying integrated circuits.

Standardization of integrated circuit packages provides advantages in electronics manufacturing. For example, standardized integrated circuit packages are easily handled by automated feed and placement equipment used to manufacture printed circuit board assemblies. Furthermore, technologies such as Tape Automated Bonding (TAB) take advantage of uniformity in the standardized packages to efficiently mount integrated circuits in the standardized packages.

Despite such advantages, there are also disadvantages to standardized packages. Because standardized packages have similar appearances, the identity of each integrated circuit contained within a respective package can become confused. Functionally different integrated circuits respectively mounted in identical standardized packages can be easily misidentified. If such misidentification takes place during assembly or repair, radically different integrated circuits can be accidently exchanged in an electronic assembly, resulting in costly damage to assembly components. For example, if the different integrated circuits are respectively mounted in packages having different designations for power and ground pins, it is likely that the integrated circuits would be damaged by power applied to the packages by the electronic assembly.

A previously known scheme to identify integrated circuits is to print identifying strings of alpha-numeric characters on a respective outer surface of each integrated circuit package, or to place a respective self adhesive label bearing such character strings on each package. Unfortunately such identification schemes are difficult to automate because machines often have difficulty reading the alpha-numeric characters. Another problem is that humans are prone to errors in reading printing or labels. Furthermore such schemes lack permanence since self adhesive labels can be accidentally rubbed off and printing can become smudged. What is needed is a reliable method for packaging and identifying integrated circuits that can be easily automated.

SUMMARY OF THE INVENTION

The present invention provides an efficient method for packaging and identifying integrated circuits. For example, in accordance with the principles of the present invention, a standard integrated circuit package is adapted to reliably encode the identity of an integrated circuit mounted therein. Because the integrated circuit is reliably identified by applying signals to the package and by sensing the signals, the method of the present invention is easily automated.

Briefly and in general terms, the method of the present invention includes providing integrated circuit packages each having a respective set of identifying electrical nodes coupled thereto. For example, if pin grid array packages are employed, a respective column of pins of each package is designated as the respective set of identifying electrical nodes. For each of the packages, a respective one of the integrated circuits is mounted therein.

Each of the integrated circuit packages is adapted to encode the respective identity of the respective integrated circuit mounted therein. For example, in one embodiment each integrated circuit is individually identified, just as a respective serial number written on a surface on each package would provide individual identification. In another embodiment, the present invention determines group identity for functional groups of integrated circuits, just as respective designations of "68030" or "80486SX" written on the surface of each package would provide group identification for functional groups of popular microprocessor integrated circuits. Unlike identification methods employing such writing, the present invention avoids errors introduced by humans misreading the writing and mis-identifying the integrated circuits.

For each of the packages, members of the respective set of electrical nodes are electrically interconnected in a manner associated with a respective identity of the respective integrated circuit mounted therein. This is preferably accomplished by grouping members of the respective set of nodes into non-null disjoint subsets that are associated with the respective identity of the respective integrated circuit. It is preferred that respective node members of each disjoint subset are electrically interconnected by shorting them together. For each of the packages, electrical signals are applied to members of the respective set of nodes. By sensing the electrical signals conducted between electrically interconnected members of the respective set of nodes, the present invention efficiently and reliably identifies the respective integrated circuits. Other aspects and advantages of the present invention will become apparent with the accompanying drawings, illustrating by way of example the principles of the invention.

BRIEF DESCRIPTION OF THE DRAWINGS

FIG. 6 is a table showing 5 alternative ways of grouping a set of 3 electrical nodes into disjoint subsets and a respective interconnection of the nodes corresponding to each grouping.

FIG. 7 is a table showing 15 alternative ways of grouping a set of 4 electrical nodes into disjoint subsets and a respective interconnection of the nodes corresponding to each grouping.

DETAILED DESCRIPTION OF PREFERRED EMBODIMENT

Figure 1:
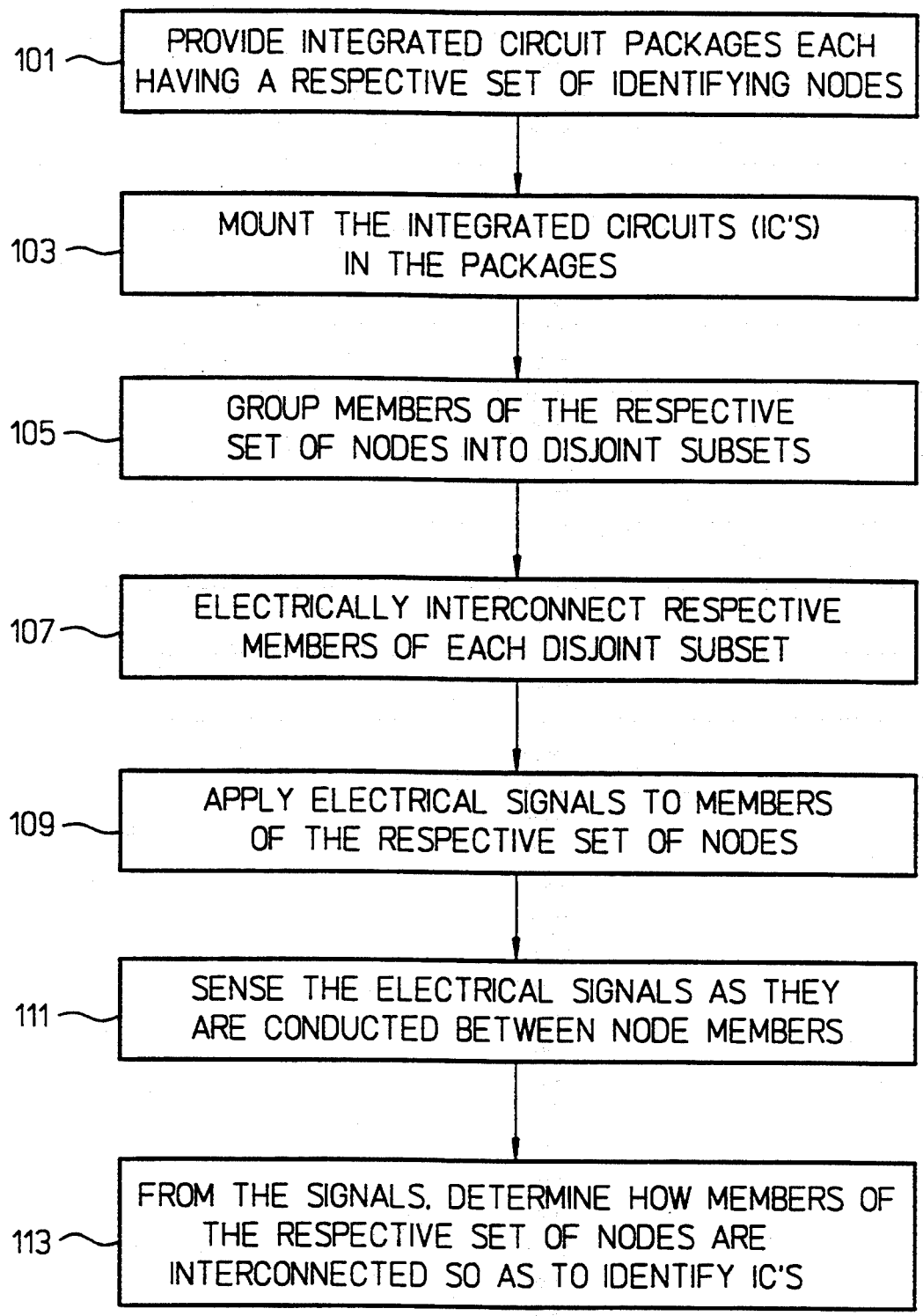
FIG. 1 shows a flow chart illustrating a preferred method of the present invention.
Figure 2A:
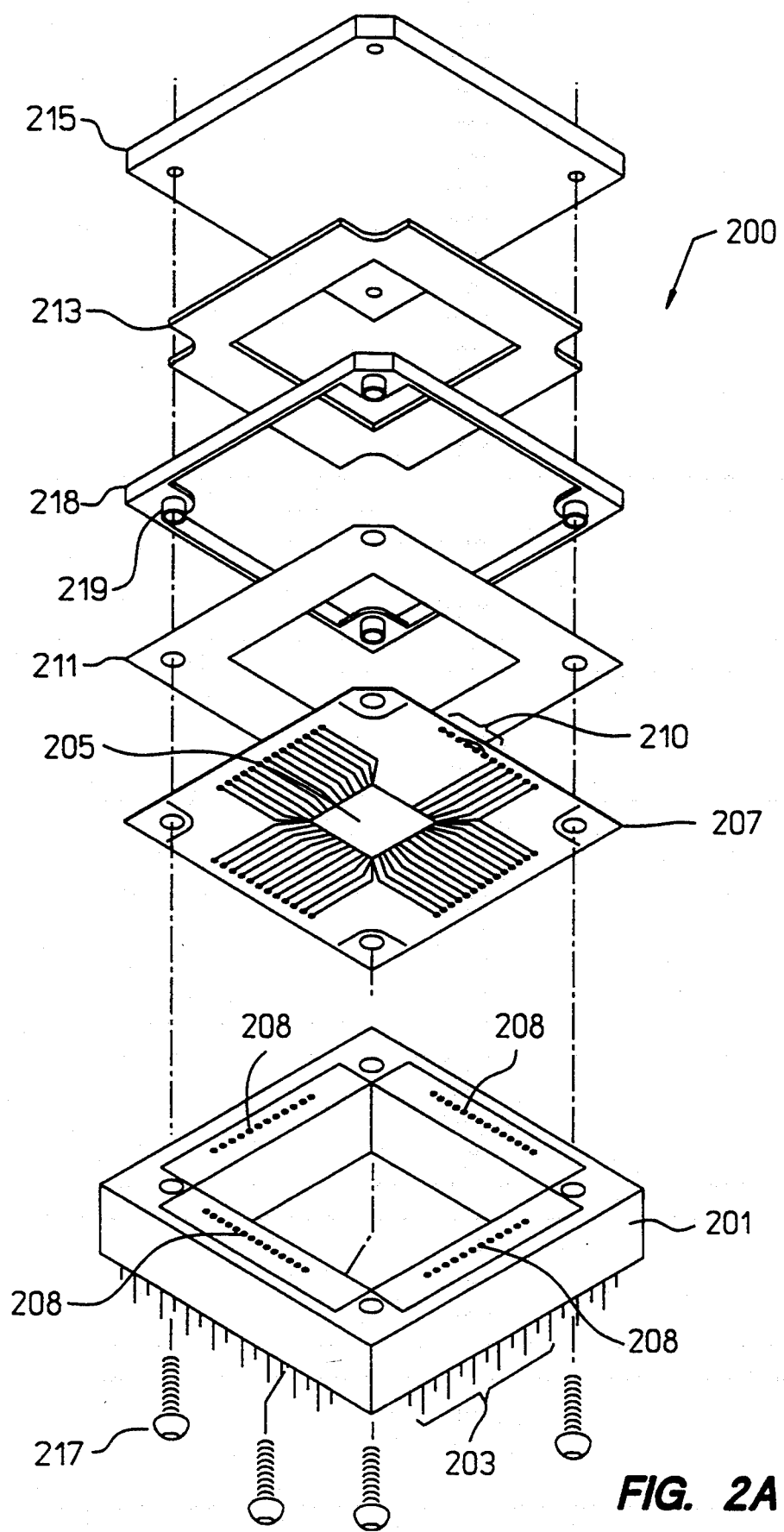
FIG. 2A shows a Tape Automated Bonding (TAB) package employed in conjunction with the preferred embodiment of the present invention.

A preferred embodiment of the method of the present invention is illustrated in the flow chart of FIG. 1. As indicated by block 101 of the flow chart, integrated circuit packages are provided, each having a respective set of identifying electrical nodes. Though different types of integrated circuit packages can be employed in conjunction with the present invention, it is preferred to employ Tape Automated Bonding (TAB) packages. Because of their manufacturing flexibility, TAB packages are easily adapted in accordance with the teachings of the present invention. For example, FIG. 2A illustrates one of the Tape Automated Bonding (TAB) packages 200 specially adapted in accordance with the teachings of the present invention. The adapted TAB package 200 shown in FIG. 2A includes a pin grid array (PGA) plug 201 having a plurality of pins. In the preferred embodiment, each of the TAB packages has a respective column of 6 pins that are designated as a respective set of 6 identifying electrical nodes. Accordingly, FIG. 2A shows 6 designated identifying nodes, 203, for the TAB package 200.

FIG. 2A further shows an integrated circuit 205, for mounting in the TAB package, in conformance with block 103 of the flow chart in FIG. 1. As shown in FIG. 2A, the integrated circuit 205 is mounted on a TAB frame 207 and electrically connected to inner leads of the TAB frame by a suitable method, such as thermocompression welding. The TAB frame 207 is mounted on the pin grid array plug 201.

In conformance with block 105 of the flow chart of FIG. 1, members of the respective set of nodes are grouped into disjoint subsets that are a partition of the respective set of nodes. In general, disjoint subsets are subsets having no elements in common. Furthermore, since the subsets are a partition of the respective set of nodes, a union of all of the subsets is just the respective set of nodes, and none of the subsets are the null set (set without any elements). An equivalent mathematic expression is as follows:

If $S = \{1, 2, \ldots, n\}$, then by a partition of S we mean a family of subsets $T_1, T_2, \ldots, T_k$ satisfying:

$$T_i \cap T_j = \{\} \text{ for } i \neq j$$

and $$\bigcup_{i=1}^{k} T_i = S$$

and $$T_i \neq \{\} \text{ for } (i = 1, \ldots, k)$$

For example, given that the respective set of six nodes are notionally numbered 1 through 6, members of the set can be grouped into a set of 3 subsets written as $\{\{1,2\}, \{3,6\}, \{4,5\}\}$, which are an exemplary partition of the set of six nodes. By inspection it can be seen that the 3 subsets of the example satisfy the three requirements of a partition. Specifically, the 3 subsets are disjoint; a union of the subsets is the set of six nodes; and none of the subsets are the null set. A further discussion of partitions of sets, as well as an algorithm flow chart and FORTRAN code is found in "Combinatorial Algorithms" by Albert Nijenhuis and Herbert S. Wilf, Academic Press New York (1975) Pg. 81–86. Because these pages provide helpful supportive teachings, they are incorporated herein by reference.

Members of the respective set of nodes are grouped into disjoint subsets that are associated with the respective identity of the respective integrated circuit mounted in each package. In one embodiment each integrated circuit is individually identified, just as a respective serial number written on a surface on each package would provide individual identification. For example, the grouping of elements into subsets corresponding to the partition $\{\{1,2\}, \{3,6\}, \{4,5\}\}$ is associated with the individual identity of the integrated circuit. In another embodiment, the present invention determines group identity for functional groups of integrated circuits, just as respective designations of "68030" or "80486SX" written on the surface of each package would provide group identification for functional groups of popular microprocessor integrated circuits. For example, the grouping of elements into subsets corresponding to the partition $\{\{1,2\}, \{3,6\}, \{4,5\}\}$ is associated with the group identity of the integrated circuit.

In conformance with block 107 of the flow chart of FIG. 1, respective node members of each disjoint subset are electrically interconnected, preferably by shorting together the respective node members of each disjoint subset. Shorting is preferred because such interconnections are especially easy to sense, as discussed in greater detail later herein. Furthermore, it is preferred that TAB tape technology, exemplified by the TAB frame 207 shown in FIG. 2A, be specially adapted for interconnecting respective node members. The TAB frame 207 is conventionally employed in TAB packages for electrically interconnecting the integrated circuit to other points of the package, such as plug surface contacts 208 that are electrically coupled to the pins of the pin grid array plug 201. However, in accordance with the teachings of the present invention, the TAB frame 207 is specially adapted to short together the respective node members of each disjoint set. For example, as shown in FIG. 2A, the TAB frame 207 has a column of 6 frame contacts 210, which mate with 6 surface contacts of the PGA plug. Each one of the 6 plug surface contacts is electrically coupled to a respective member of the column of 6 pins 203, designated as identifying nodes. As explained herein, by selectively interconnecting the 6 frame contacts, the respective node members of each disjoint subset are shorted together.

Figure 2B:
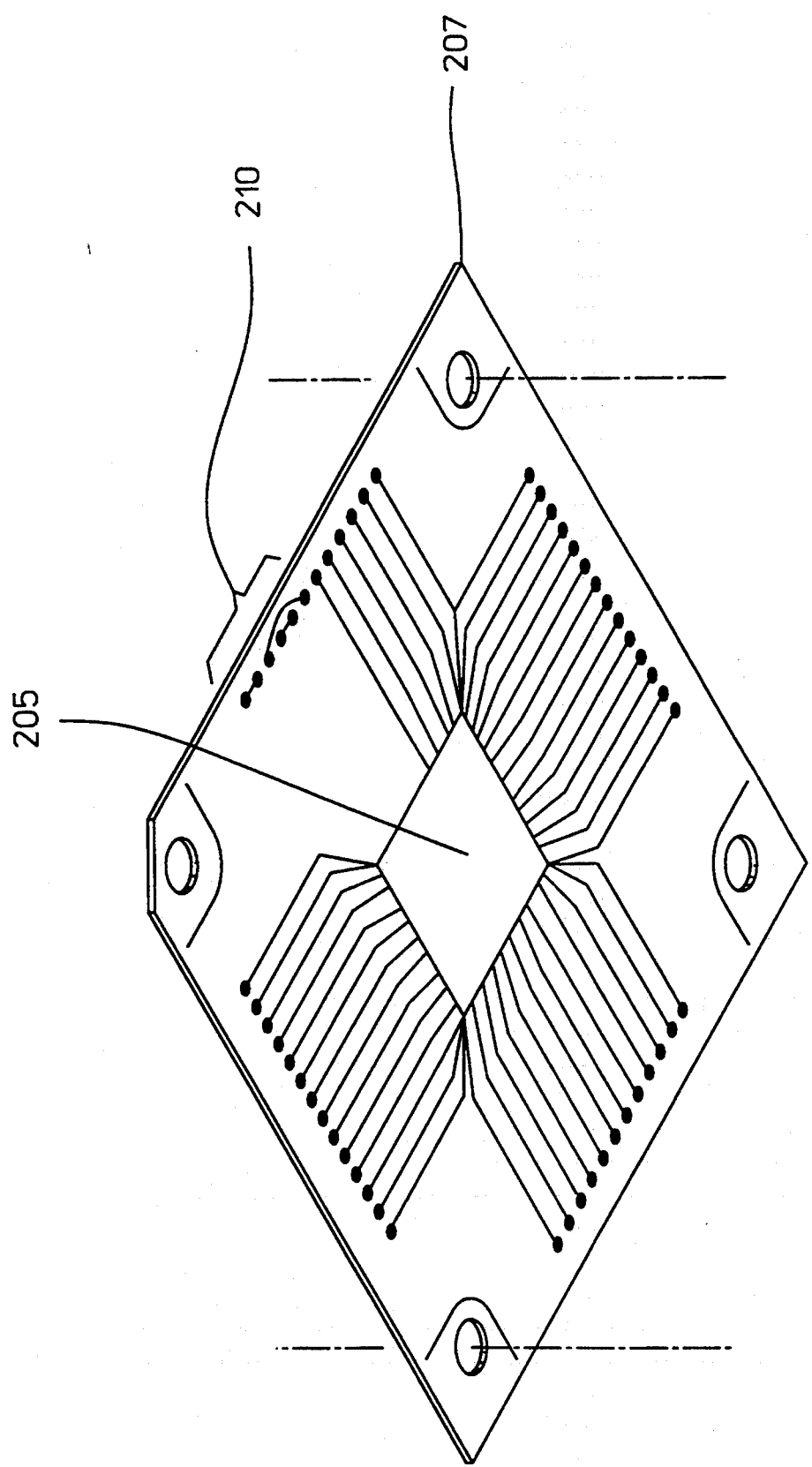
FIG. 2B is an expanded view of a TAB frame shown in FIG. 2A.

Upon assembly of the TAB package shown in FIG. 2, the TAB frame 207 is clamped into contact with the pin grid array plug 201. Accordingly, each member of the column of 6 frame contacts 210 is electrically coupled to a respective member of the column of 6 pins 203 designated as identifying nodes. Relying on TAB tape manufacturing technology, the TAB frame is specially adapted to include circuit pathways selectively interconnecting the 6 frame contacts 210 so as to short together the respective node members of each disjoint subset of the set of 6 nodes. For example, the circuit pathways short together pins 1 and 2, short together pins 3 and 6, and short together pins 4 and 5, in accordance with the exemplary partition $\{\{1,2\}, \{3,6\}, \{4,5\}\}$ discussed previously herein. An expanded view of the TAB frame 207 is shown in FIG. 2B A thin stainless steel membrane 211 is disposed between the top of the TAB frame 207 and an elastomeric planarizer 213 made of silicon rubber approximately 40 mils thick. Positioned on top of the elastomeric planarizer 213, and in thermal contact with the integrated circuit, 205, is a heat spreader 215. Screws 217 pass through the pin grid array plug 201, TAB frame 207, membrane 211, and thread into the heat spreader. An alignment frame 218 includes protruding bosses 219 and serves to align the TAB frame, planarizer, membrane, and heat spreader. The bosses 219 are inserted into apertures in the pin grid array plug 201 to assure alignment of the TAB frame contacts with surface contacts 208 of the pin grid array plug contacts. As the screws 217 are threaded into the heat spreader 215, the elastomeric planarizer 213 is compressed, thereby forcing the TAB frame 207 into contact with the pin grid array plug 201.

While FIGS. 2A and 2B illustrate a particular TAB package adapted in accordance with the teachings of the present invention, it should be understood that the teachings of the present invention are not limited to the adapted TAB package shown in FIGS. 2A and 2B. Alternative TAB packages, as well as other integrated circuit packages are specially adapted in accordance with the teachings of the present invention with beneficial results. For example, U.S. Pat. No. 5,162,975 entitled "Integrated Circuit Demountable Tab Apparatus" issued to Matta et al. illustrates another TAB package that can be adapted in accordance with the teachings of the present invention. Because this patent provides helpful supportive teachings of TAB technology, it is incorporated herein by reference.

In the present invention, members of the respective set of identifying node are grouped into disjoint subsets that are associated with the respective individual identity or group identity of the respective integrated circuit mounted in each package, as discussed previously herein. Accordingly, in one embodiment each integrated circuit is individually identified by shorting together the respective node members of each disjoint subset, just as a respective serial number written on a surface on each package would provide individual identification. No two packages have pins shorted together in the same way. In another embodiment, the present invention determines a respective group identity for each member of a functional group of integrated circuits by shorting together the respective node members of each disjoint subset, just as respective designations of "68030" or "80486SX" written on the surface of each package would provide group identification for functional groups of popular microprocessor integrated circuits. All packages sharing the same group identity have the pins shorted together in the same way. Accordingly, the method of the present invention adapts standard integrated circuit packages to reliably encode the identity of an integrated circuit mounted therein.

Later, during activities such as repairing or assembling electronic assemblies that include the integrated circuits, the adapted packages are conveniently employed to identify the integrated circuits mounted therein. The respective integrated circuit mounted in each package is identified by determining how members of the respective set of nodes of the package are electrically interconnected. It is preferred that an appropriately programmed in-circuit tester be employed to determine how members of the respective set of nodes of the package are electrically interconnected.

Among popular in-circuit testers are the Hewlett Packard family of in-circuit testers. Such in-circuit testers are capable of testing for short circuits and open circuits. In-circuit testers are conventionally employed by placing electronic assemblies in a "bed of nails" test fixture of the tester so that desired locations of the electronic assembly are probed and tested. In accordance with a preferred embodiment of the present invention, the adapted integrated circuit packages discussed previously herein are mounted in the electronic assemblies and respective identifying nodes of the packages are probed by the "bed of nails" fixture.

In accordance with the flow chart shown in FIG. 1, the in-circuit tester applies electrical signals to members of the respective set of nodes (block 109), respectively senses the electrical signals conducted between electrically interconnected members of the respective set of nodes (block 111), and determines how members of the respective set of nodes are interconnected based upon the electrical signals respectively sensed (block 113).

Because of the importance of safeguarding components of electronic assemblies from being damaged during testing, it is preferred that a Hewlett Packard model 3065 or model 3070 in-circuit tester having safeguard features be employed in conjunction with the method of the present invention. The October 1984 issue or the Hewlett Packard Journal discusses in-circuit testing and in particular discusses the model 3065 in-circuit tester. The articles therein entitled "Automatic Test Program Generation for Digital Board Testing" and "Testing for Short-Circuit Failures" are particularly helpful. Additionally, U.S. Pat. No. 4,785,235 entitled "Shorts Testing Technique Reducing Phantom Shorts Problems" issued to Hendricks et al. provides a further discussion of short circuit testing methods employed in the model 3065 in-circuit tester. Because this patent and the October 1984 Hewlett Packard Journal provide helpful supportive teachings, they are incorporated herein by reference. It should be understood that while it is preferred that an in-circuit tester such as the Hewlett Packard in-circuit tester be employed in conjunction with the method of the present invention to determine how members of the respective set of nodes are electrically interconnected, the present invention is not strictly limited to employing the in-circuit tester, since other means for determining how nodes are electrically interconnected are employed by those skilled in the art, in accordance with the teachings of the present invention.

Figure 3:
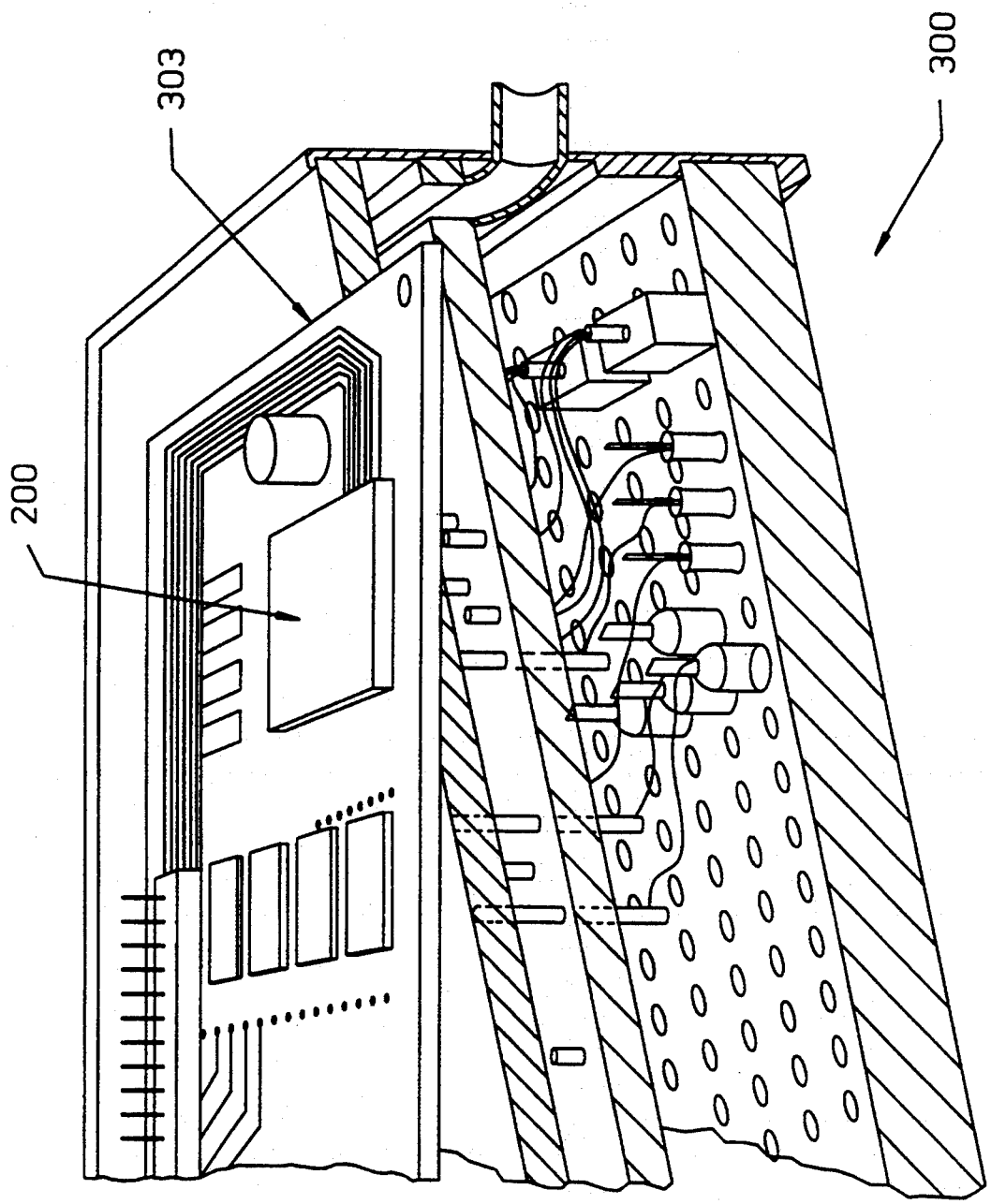
FIG. 3 is a perspective cut away view of a "bed of nails" test fixture employed in conjunction with the preferred embodiment of the present invention.

FIG. 3 is a perspective cut away view of the "bed of nails" test fixture 300 employed in conjunction with the preferred embodiment of the present invention. As shown in FIG. 3, the adapted TAB package 200 is loaded into the electronic assembly 303, which in turn is loaded into the test fixture 300. The test fixture includes spring-loaded "pogo" pins that extend upwardly from the test fixture to electrically contact identifying nodes of the adapted TAB package.

Figure 4:
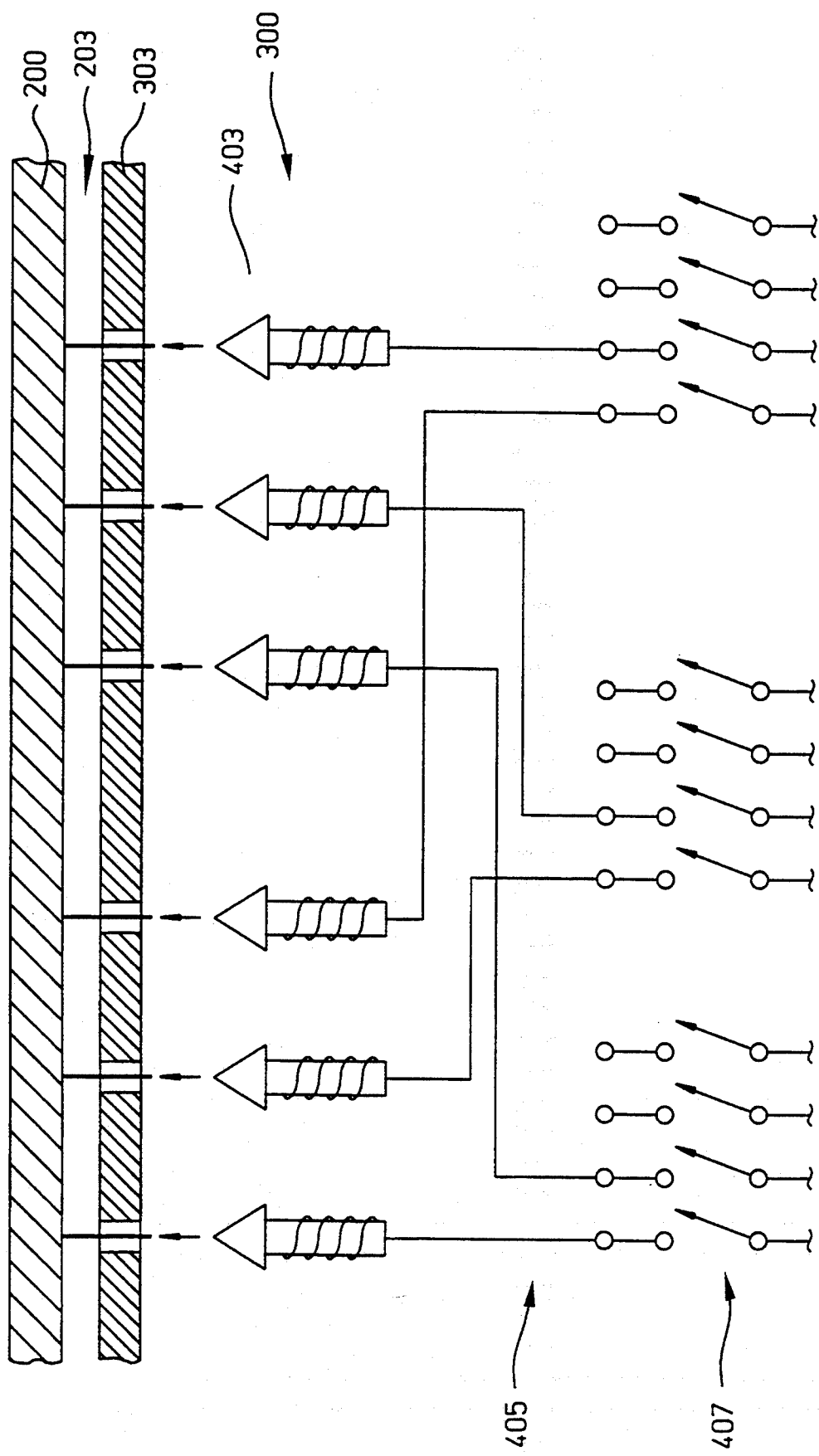
FIG. 4 is partial schematic diagram showing a detailed view of the bed of nails test fixture.

FIG. 4 is a partial schematic diagram showing a detailed cut away side view of the bed of nails test fixture 300. In FIG. 4, a cut away side view of the adapted TAB package 200 shows the column of 6 pins 203 designated as the respective set of 6 identifying electrical nodes in the preferred embodiment. In FIG. 4 a cut away side view of the electronic assembly 303 shows apertures in the assembly for receiving the 6 pins designated as identifying nodes. As shown in FIG. 4, a corresponding 6 spring-loaded "pogo" pins 403 of the test fixture extend upwardly to contact the nodes of the adapted TAB package. Fixture wiring 405 couples the spring-loaded pins to switches 407 of scanner test cards, suitably employed by the in-circuit test system to apply signals to the identifying nodes and to sense the signals as they are conducted between interconnected members of the set of nodes.

Figure 5:
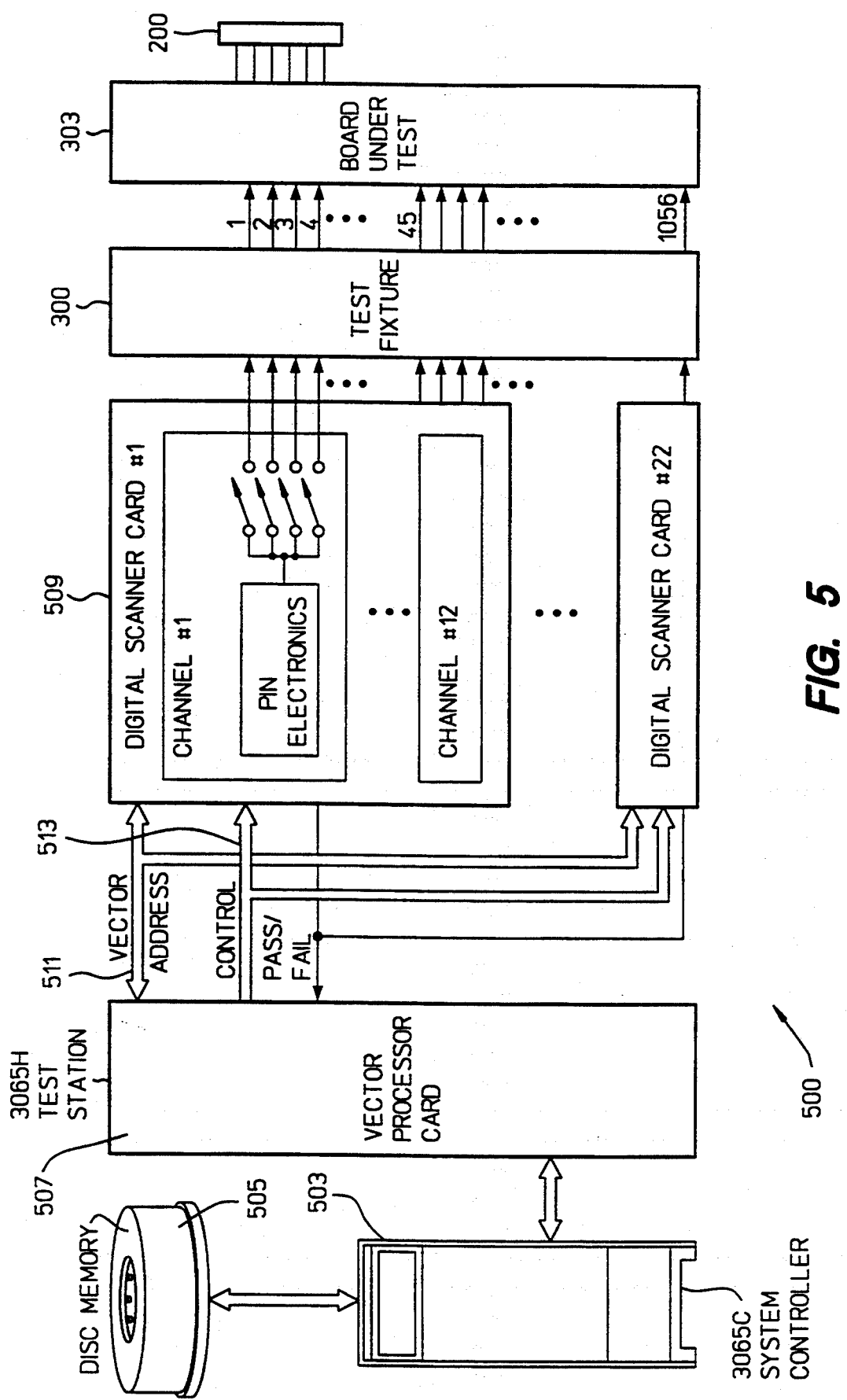
FIG. 5 is a partial block diagram of an in-circuit test system employed in conjunction with the preferred embodiment of the present invention.

FIG. 5 is a partial block diagram of the in-circuit test system 500 employed in conjunction with the preferred embodiment of the present invention. As shown in FIG. 5, the system includes a system controller 503 coupled to a disc memory 505 and a test station 507 having test vector processing capabilities. One or more scanner cards 509 are coupled to the test station by vector address and control busses 511, 513. The scanner cards are coupled to the test fixture 300, which probes the adapted package 200 mounted in the electronic assembly 303 as discussed previously herein.

In the preferred embodiment, the system controller 503 accesses the disc memory to load a machine executable encoding of the shorts testing method described in the previously referenced patent, suitably adapted for identifying the integrated circuit mounted in the adapted package 200. The system controller 503 controls the test station, which in turn controls the scanner cards to apply suitable electrical signals to members of the set of identifying nodes of the adapted package 200. In the preferred embodiment, a binary search test sequence is performed to determine which nodes are shorted together. Through the test fixture 300, the scanner cards respectively sense the electrical signals conducted between electrically interconnected members of the set of identifying nodes. Using the adapted shorts testing method, the system controller controls the scanner cards, determining how members of the respective set of nodes are interconnected based upon the electrical signals respectively sensed. A data base program running on the system controller in conjunction with a display device coupled thereto can provide a display of further information about each integrated circuit, based upon how members of the respective nodes of each integrated circuit package are interconnected.

In general, the larger the number of elements in the respective set of identifying nodes, the greater number of different ways to group disjoint subsets of each of the respective sets into partitions. It should be noted that identifying nodes are not generally available for use as signal pathways by the respective integrated circuit mounted in each package. Therefore, there is some trade off between a desire to maximize the number of different ways to partition each of the respective sets of identifying nodes and a desire to maximize availability of nodes for use as signal pathways. Accordingly it is preferred that the respective set of identifying electrical nodes has a numerical membership in a range of 4 to 10 members.

The number of different ways to partition each of the respective sets of identifying nodes increases rapidly with the number of elements in each of the respective sets of identifying nodes. The following table, Table 1, summarizes this relationship for sets having membership of 2 elements to sets having membership of 10 elements.

TABLE 1

| Number of Elements in Sets | Number of Partitions |
| --- | --- |
| 2 | 2 |
| 3 | 5 |
| 4 | 15 |
| 5 | 52 |
| 6 | 203 |
| 7 | 877 |
| 8 | 4,140 |
| 9 | 21,147 |
| 10 | 115,975 |

It is particularly preferred that the respective set of identifying electrical nodes has a numerical membership in a range of 5 to 8 members, so that there are 15 or more ways to partition the set, but only 8 or fewer identifying nodes are needed. It is especially preferred that the respective set of identifying electrical nodes has a numerical membership of 6 members so that only 6 nodes are employed to yield 203 different partitions.

To further illustrate the present invention, a table shown in FIG. 6 shows 5 alternative ways of grouping a set of 3 electrical nodes into disjoint subsets and a respective interconnection of the nodes corresponding to each grouping. Each of the three electrical nodes are respectively numbered 1, 2, and 3. Entries in the left hand side of the table of FIG. 6 show different ways of grouping nodes 1, 2, and 3 into disjoint sets that are partitions of the set of three nodes. Entries in the right side of the table of FIG. 6 shows the respective interconnection of the three nodes corresponding to each grouping. Line segments shown as interconnecting the nodes in the right hand side of the table of FIG. 6 are representative of circuit pathways interconnecting the nodes.

As shown in the table of FIG. 6, a first entry on the left hand side of the table of FIG. 6 is "{{1, 2, 3}}", which shows nodes 1, 2, and 3 all grouped together. A first entry on the right hand side of the table of FIG. 6 shows nodes 1, 2, and 3 interconnected by line segments, corresponding to nodes 1, 2, and 3 being grouped together. As another example, a second entry on the left hand side of the table of FIG. 6 is "{{1,2}, {3}}", which shows nodes 1 and 2 grouped together and further shows node 3 grouped separately from nodes 1 and 2. A second entry on the right hand side of the table of FIG. 6 shows nodes 1 and 2 interconnected by a line segment and node 3 unconnected, which corresponds to nodes 1 and 2 being grouped together and to node 3 being grouped separately.

To further illustrate the present invention, a table of FIG. 7 shows 15 alternative ways of grouping a set of 4 electrical nodes into disjoint subsets and a respective interconnection of the nodes corresponding to each grouping. As shown in the table of FIG. 7, a first entry on the left hand side of the table of FIG. 7 is "{{1, 2, 3, 4}}", which shows nodes 1, 2, 3, and 4 all grouped together. A first entry on the right hand side of the table of FIG. 7 shows nodes 1, 2, 3, and 4 interconnected by line segments, corresponding to nodes 1, 2, 3, and 4 being grouped together. As another example, a second entry on the left hand side of the table of FIG. 7 is "{{1, 2, 3}, {4}}", which shows nodes 1, 2, and 3 grouped together and further shows node 4 grouped separately from nodes 1, 2 and 3. A second entry on the right hand side of the table of FIG. 7 shows nodes 1, 2 and 3 interconnected by line segments and node 4 unconnected, which corresponds to nodes 1, 2 and 3 being grouped together and to node 4 being grouped separately.

An appendix to the present application provides further exemplary teachings, including a short program written in the Mathematica programming language, Version 2.1, for generating a list of the 52 groupings that are partitions of 5 nodes. The appendix lists the 52 groupings generated by the program. By replacing the first line of the program, n=5, with n=6, the program is easily modified to produce the 203 groupings that are partitions of 6 nodes. The appendix lists the 203 grouping generated by the modified program. Accordingly, it should be understood that the program is easily modified to produce groupings that are partitions of any desired number of nodes. In accordance with such groupings, said desired number of nodes are interconnected to identify the integrated circuit mounted in the package.

In accordance with the principles of the present invention, a standard integrated circuit package is adapted to reliably encode the identity of an integrated circuit mounted therein. Because the integrated circuit is reliably identified by applying signals to the package and by sensing the signals, the method of the present invention is easily automated. Although a specific embodiment of the invention has been described and illustrated, the invention is not to be limited to the specific forms or arrangements or parts so described and illustrated, and various modifications and changes can be made without departing the scope and spirit of the invention. Within the scope of the appended claims, therefore, the invention may be practiced otherwise than as specifically described and illustrated.

APPENDIX

This appendix provides further exemplary teachings, including the following short program written in the Mathematica programming language, Version 2.1, for generating a list of the 52 groupings that are partitions of 5 nodes:

```
n = 5
s = Table[1,{n}]; accrue = {s}
While[Max[s] ! = n, i = n;
    While[Count[s, s[[i]]] = = 1, s[[i]] = 1; i = i − 1;];
    s[[i]] = s[[i]] + 1; accrue = Append[accrue, s];]
f[x__, y__]:= Flatten[Position[x, y, 1]]
result = Table[f[Part[accrue, j], k], {j, Length[accrue]},
    {k, Max[accrue[[j]]]}]
```

The program result is a list of the 52 groupings generated by the program. The 52 groupings are as follows:

| | | | |
|---|---|---|---|
| {{1, 2, 3, 4, 5}}, | {{1, 2, 3, 4}, {5}}, | {{1, 2, 3, 5}, {4}}, | {{1, 2, 3}, {4, 5}}, |
| {{1, 2, 3}, {4}, {5}}, | {{1, 2, 4, 5}, {3}}, | {{1, 2, 4}, {3, 5}}, | {{1, 2, 4}, {3}, {5}}, |
| {{1, 2, 5}, {3, 4}}, | {{1, 2}, {3, 4, 5}}, | {{1, 2}, {3, 4}, {5}}, | {{1, 2, 5}, {3}, {4}}, |
| {{1, 2}, {3, 5}, {4}}, | {{1, 2}, {3}, {4, 5}}, | {{1, 2}, {3}, {4, 5}}, | {{1, 3, 4, 5}, {2}}, |
| {{1, 3, 4}, {2, 5}}, | {{1, 3, 4}, {2}, {5}}, | {{1, 3, 5}, {2, 4}}, | {{1, 3}, {2, 4, 5}}, |
| {{1, 3}, {2, 4}, {5}}, | {{1, 3, 5}, {2}, {4}}, | {{1, 3}, {2, 5}, {4}}, | {{1, 3}, {2}, {4, 5}}, |
| {{1, 3}, {2}, {4}, {5}}, | {{1, 4, 5}, {2, 3}}, | {{1, 4}, {2, 3, 5}}, | {{1, 4}, {2, 3}, {5}}, |
| {{1, 5}, {2, 3, 4}}, | {{1}, {2, 3, 4, 5}}, | {{1}, {2, 3, 4}, {5}}, | {{1, 5}, {2, 3}, {4}}, |
| {{1}, {2, 3, 5}, {4}}, | {{1}, {2, 3}, {4, 5}}, | {{1}, {2, 3}, {4}, {5}}, | {{1, 4, 5}, {2}, {3}}, |
| {{1, 4}, {2, 5}, {3}}, | {{1, 4}, {2}, {3, 5}}, | {{1, 4}, {2}, {3}, {5}}, | {{1, 5}, {2, 4}, {3}}, |
| {{1}, {2, 4, 5}, {3}}, | {{1}, {2, 4}, {3, 5}}, | {{1}, {2, 4}, {3}, {5}}, | {{1, 5}, {2}, {3, 4}}, |
| {{1}, {2, 5}, {3, 4}, | {{1}, {2}, {3, 4, 5}}, | {{1}, {2}, {3, 4}, {5}}, | {{1, 5}, {2}, {3}, {4}}, |
| {{1}, {2, 5}, {3}, {4}}, | {{1}, {2}, {3, 5}, {4}}, | {{1}, {2}, {3}, {4, 5}}, | {{1}, {2}, {3}, {4}, {5}}} |

By replacing the first line of the program, n=5, with n=6, the program is easily modified to produce the 203 groupings that are partitions of 6 nodes. The modified program result is a list of the 203 groupings. The 203 groupings are as follows:

| | | |
|---|---|---|
| {{1, 2, 3, 4, 5, 6}}, | {{1, 2, 3, 4, 5}, {6}}, | {{1, 2, 3, 4, 6}, {5}}, |
| {{1, 2, 3, 4}, {5, 6}}, | {{1, 2, 3, 4}, {5}, {6}}, | {{1, 2, 3, 5, 6}, {4}}, |
| {{1, 2, 3, 5}, {4, 6}}, | {{1, 2, 3, 5}, {4}, {6}}, | {{1, 2, 3, 6}, {4, 5}}, |
| {{1, 2, 3}, {4, 5, 6}}, | {{1, 2, 3}, {4, 5}, {6}}, | {{1, 2, 3, 6}, {4}, {5}}, |
| {{1, 2, 3}, {4, 6}, {5}}, | {{1, 2, 3}, {4}, {5, 6}}, | {{1, 2, 3}, {4}, {5}, {6}}, |
| {{1, 2, 4, 5, 6}, {3}}, | {{1, 2, 4, 5}, {3, 6}}, | {{1, 2, 4, 5}, {3}, {6}}, |
| {{1, 2, 4, 6}, {3, 5}}, | {{1, 2, 4}, {3, 5, 6}}, | {{1, 2, 4}, {3, 5}, {6}}, |
| {{1, 2, 4, 6}, {3}, {5}}, | {{1, 2, 4}, {3, 6}, {5}}, | {{1, 2, 4}, {3}, {5, 6}}, |
| {{1, 2, 4}, {3}, {5}, {6}}, | {{1, 2, 5, 6}, {3, 4}}, | {{1, 2, 5}, {3, 4, 6}}, |
| {{1, 2, 5}, {3, 4}, {6}}, | {{1, 2, 6}, {3, 4, 5}}, | {{1, 2}, {3, 4, 5, 6}}, |
| {{1, 2}, {3, 4, 5}, {6}}, | {{1, 2, 6}, {3, 4}, {5}}, | {{1, 2}, {3, 4, 6}, {5}}, |
| {{1, 2}, {3, 4}, {5, 6}}, | {{1, 2}, {3, 4}, {5}, {6}}, | {{1, 2, 5, 6}, {3}, {4}}, |
| {{1, 2, 5}, {3, 6}, {4}}, | {{1, 2, 5}, {3}, {4, 6}}, | {{1, 2, 5}, {3}, {4}, {6}}, |
| {{1, 2, 6}, {3, 5}, {4}}, | {{1, 2}, {3, 5, 6}, {4}}, | {(1, 2}, {3, 5}, {4, 6}}, |
| {{1, 2}, {3, 5}, {4}, {6}}, | {{1, 2, 6}, {3}, {4, 5}}, | {{1, 2}, {3, 6}, {4, 5}}, |
| {{1, 2}, {3}, {4, 5, 6}}, | {{1, 2}, {3}, {4, 5}, {6}}, | {{1, 2}, {3, 6}, {4, 5}}, |
| {{1, 2}, {3}, {4, 5, 6}}, | {{1, 2, 6}, {3}, {4, 5}}, | {{1, 2}, {3, 6}, {4, 5}}, |
| {{1, 2}, {3}, {4, 5, 6}}, | {{1, 2}, {3}, {4, 5}, {6}}, | {{1, 2}, {3, 6}, {4, 5}}, |
| {{1, 2}, {3}, {4, 5, 6}}, | {{1, 2}, {3}, {4, 5}, {6}}, | {{1, 2}, {3, 6}, {4, 5}}, |
| {{1, 2}, {3}, {4, 6}, {5}}, | {{1, 2}, {3}, {4, 5, 6}}, | {{1, 2}, {3}, {4}, {5, 6}}, |
| {{1, 2}, {3}, {4}, {5}, {6}}, | {{1, 3, 4, 5, 6}, {2}}, | {{1, 3, 4, 5}, {2, 6}}, |
| {{1, 3, 4, 5}, {2}, {6}}, | {{1, 3, 4, 6}, {2, 5}}, | {{1, 3, 4}, {2, 5, 6}}, |
| {{1, 3, 4}, {2, 5}, {6}}, | {{1, 3, 4, 6}, {2}, {5}}, | {{1, 3, 4}, {2, 6}, {5}}, |
| {{1, 3, 4}, {2}, {5, 6}}, | {{1, 3, 4}, {2}, {5}, {6}}, | {{1, 3, 5, 6}, {2, 4}}, |
| {{1, 3, 5}, {2, 4, 6}}, | {{1, 3, 5}, {2, 4}, {6}}, | {{1, 3, 6}, {2, 4, 5}}, |
| {{1, 3}, {2, 4, 5, 6}}, | {{1, 3}, {2, 4, 5}, {6}}, | {{1, 3, 6}, {2, 4}, {5}}, |
| {{1, 3}, {2, 4, 6}, {5}}, | {{1, 3}, {2, 4}, {5, 6}}, | {{1, 3}, {2, 4}, {5}, {6}}, |
| {{1, 3, 5, 6}, {2}, {4}}, | {{1, 3, 5}, {2, 6}, {4}}, | {{1, 3, 5}, {2}, {4, 6}}, |
| {{1, 3, 5}, {2}, {4}, {6}}, | {{1, 3, 6}, {2, 5}, {4}}, | {{1, 3}, {2, 5, 6}, {4}}, |
| {{1, 3}, {2, 5}, {4, 6}}, | {{1, 3}, {2, 5}, {4}, {6}}, | {{1, 3, 6}, {2}, {4, 5}}, |
| {{1, 3}, {2, 6}, {4, 5}}, | {{1, 3}, {2}, {4, 5, 6}}, | {{1, 3}, {2}, {4, 5}, {6}}, |
| {{1, 3, 6}, {2}, {4}, {5}}, | {{1, 3}, {2, 6}, {4}, {5}}, | {{1, 3}, {2}, {4, 6}, {5}}, |
| {{1, 3}, {2}, {4}, {5, 6}}, | {{1, 3}, {2}, {4}, {5}, {6}}, | {{1, 4, 5, 6}, {2, 3}}, |
| {{1, 4, 5}, {2, 3, 6}}, | {{1, 4, 5}, {2, 3}, {6}}, | {{1, 4, 6}, {2, 3, 5}}, |
| {{1, 4}, {2, 3, 5, 6}}, | {{1, 4}, {2, 3, 5}, {6}}, | {{1, 4, 6}, {2, 3}, {5}}, |
| {{1, 4}, {2, 3, 6}, {5}}, | {{1, 4}, {2, 3}, {5, 6}}, | {{1, 4}, {2, 3}, {5}, {6}}, |
| {{1, 5, 6}, {2, 3, 4}}, | {{1, 5}, {2, 3, 4, 6}}, | {{1, 5}, {2, 3, 4}, {6}}, |
| {{1, 6}, {2, 3, 4, 5}}, | {{1}, {2, 3, 4, 5, 6}}, | {{1}, {2, 3, 4, 5}, {6}}, |
| {{1, 6}, {2, 3, 4}, {5}}, | {{1}, {2, 3, 4, 6}, {5}}, | {{1}, {2, 3, 4}, {5, 6}}, |
| {{1}, {2, 3, 4}, {5}, {6}}, | {{1, 5, 6}, {2, 3}, {4}}, | {{1, 5}, {2, 3, 6}, {4}}, |
| {{1, 5}, {2, 3}, {4, 6}}, | {{1, 5}, {2, 3}, {4}, {6}}, | {{1, 6}, {2, 3, 5}, {4}}, |
| {{1}, {2, 3, 5, 6}, {4}}, | {{1}, {2, 3, 5}, {4, 6}}, | {{1}, {2, 3, 5}, {4}, {6}}, |
| {{1}, {2, 3, 5, 6}, {4}}, | {{1}, {2, 3, 5}, {4, 6}}, | {{1}, {2, 3, 5}, {4}, {6}}, |

-continued

| | | |
|---|---|---|
| {{1, 6}, {2, 3}, {4, 5}}, | {{1}, {2, 3, 6}, {4, 5}}, | {{1}, {2, 3}, {4, 5, 6}}, |
| {{1}, {2, 3}, {4, 5}, {6}}, | {{1, 6}, {2, 3}, {4}, {5}}, | {{1}, {2, 3, 6}, {4}, {5}}, |
| {{1}, {2, 3}, {4, 6}, {5}}, | {{1}, {2, 3}, {4}, {5, 6}}, | {{1}, {2, 3}, {4}, {5}, {6}}, |
| {{1, 4, 5, 6}, {2}, {3}}, | {{1, 4, 5}, {2, 6}, {3}}, | {{1, 4, 5}, {2}, {3, 6}}, |
| {{1, 4, 5}, {2}, {3}, {6}}, | {{1, 4, 6}, {2, 5}, {3}}, | {{1, 4}, {2, 5, 6}, {3}}, |
| {{1, 4}, {2, 5}, {3, 6}}, | {{1, 4}, {2, 5}, {3}, {6}}, | {{1, 4, 6}, {2}, {3, 5}}, |
| {{1, 4}, {2, 6}, {3, 5}}, | {{1, 4}, {2}, {3, 5, 6}}, | {{1, 4}, {2}, {3, 5}, {6}}, |
| {{1, 4, 6}, {2}, {3}, {5}}, | {{1, 4}, {2, 6}, {3}, {5}}, | {{1, 4}, {2}, {3, 6}, {5}}, |
| {{1, 4}, {2}, {3}, {5, 6}}, | {{1, 4}, {2}, {3}, {5}, {6}}, | {{1, 5, 6}, {2, 4}, {3}}, |
| {{1, 5}, {2, 4, 6}, {3}}, | {{1, 5}, {2, 4}, {3, 6}}, | {{1, 5}, {2, 4}, {3}, {6}}, |
| {{1, 6}, {2, 4, 5}, {3}}, | {{1}, {2, 4, 5, 6}, {3}}, | {{1}, {2, 4, 5}, {3, 6}}, |
| {{1}, {2, 4, 5}, {3}, {6}}, | {{1, 6}, {2, 4}, {3, 5}}, | {{1}, {2, 4, 6}, {3, 5}}, |
| {{1}, {2, 4}, {3, 5, 6}}, | {{1}, {2, 4}, {3, 5}, {6}}, | {{1, 6}, {2, 4}, {3}, {5}}, |
| {{1}, {2, 4, 6}, {3}, {5}}, | {{1}, {2, 4}, {3, 6}, {5}}, | {{1}, {2, 4}, {3}, {5, 6}}, |
| {{1}, {2, 4}, {3}, {5}, {6}}, | {{1, 5, 6}, {2}, {3, 4}}, | {{1, 5}, {2, 6}, {3, 4}}, |
| {{1, 5}, {2}, {3, 4, 6}}, | {{1, 5}, {2}, {3, 4}, {6}}, | {{1, 6}, {2, 5}, {3, 4}}, |
| {{1}, {2, 5, 6}, {3, 4}}, | {{1}, {2, 5}, {3, 4, 6}}, | {{1}, {2, 5}, {3, 4}, {6}}, |
| {{1, 6}, {2}, {3, 4, 5}}, | {{1}, {2, 6}, {3, 4, 5}}, | {{1}, {2}, {3, 4, 5, 6}}, |
| {{1}, {2}, {3, 4, 5}, {6}}, | {{1, 6}, {2}, {3, 4}, {5}}, | {{1}, {2, 6}, {3, 4}, {5}}, |
| {{1}, {2}, {3, 4, 6}, {5}}, | {{1}, {2}, {3, 4}, {5, 6}}, | {{1}, {2}, {3, 4}, {5}, {6}}, |
| {{1, 5, 6}, {2}, {3}, {4}}, | {{1, 5}, {2, 6}, {3}, {4}}, | {{1, 5}, {2}, {3, 6}, {4}}, |
| {{1, 5}, {2}, {3}, {4, 6}}, | {{1, 5}, {2}, {3}, {4}, {6}}, | {{1, 6}, {2, 5}, {3}, {4}}, |
| {{1}, {2, 5, 6}, {3}, {4}}, | {{1}, {2, 5}, {3, 6}, {4}}, | {{1}, {2, 5}, {3}, {4, 6}}, |
| {{1}, {2, 5}, {3}, {4}, {6}}, | {{1, 6}, {2}, {3, 5}, {4}}, | {{1}, {2, 6}, {3, 5}, {4}}, |
| {{1}, {2}, {3, 5, 6}, {4}}, | {{1}, {2}, {3, 5}, {4, 6}}, | {{1}, {2}, {3, 5}, {4}, {6}}, |
| {{1, 6}, {2}, {3}, {4, 5}}, | {{1}, {2, 6}, {3}, {4, 5}}, | {{1}, {2}, {3, 6}, {4, 5}}, |
| {{1}, {2}, {3}, {4, 5, 6}}, | {{1}, {2}, {3}, {4, 5}, {6}}, | {{1, 6}, {2}, {3}, {4}, {5}}, |
| {{1}, {2, 6}, {3}, {4}, {5}}, | {{1}, {2}, {3, 6}, {4}, {5}}, | {{1}, {2}, {3}, {4, 6}, {5}}, |
| {{1}, {2}, {3}, {4}, {5, 6}}, | {{1}, {2}, {3}, {4}, {5}, {6}}} | |

What is claimed is:

1. A method for identifying a range of different integrated circuits comprising the steps of:
providing a plurality of packages;
mounting a respective one of the integrated circuits in each package;
providing a plurality of sets of identifying electrical nodes, each set of nodes being coupled with a respective one of the packages;
grouping each set of nodes into disjoint subsets so that at least one of the sets of nodes is grouped into at least three disjoint subsets; and
providing a plurality of circuit pathways, wherein each circuit pathway electrically interconnects the nodes of a respective one of the disjoint subsets, so as to identify the range of different integrated circuits.

2. A method as in claim 1 wherein:
each set of identifying electrical nodes consists of a respective five identifying electrical nodes; and
the step of providing the plurality of circuit pathways includes electrically interconnecting the nodes so as to identify a range of fifty two different integrated circuits.

3. A method as in claim 1 wherein:
each set of identifying electrical nodes consists of a respective six identifying electrical nodes; and
the step of providing the plurality of circuit pathways includes electrically interconnecting the nodes so as to identify a range of two hundred and three different integrated circuits.

4. A method as in claim 1 wherein:
each set of identifying electrical nodes consists of a respective seven identifying electrical nodes; and
the step of providing the plurality of circuit pathways includes electrically interconnecting the nodes so as to identify a range of eight hundred and seventy different integrated circuits.

5. A method as in claim 1 wherein:
each set of identifying electrical nodes consists of a respective eight identifying electrical nodes; and
the step of providing the plurality of circuit pathways includes electrically interconnecting the nodes so as to identify a range of four thousand one hundred and forty different integrated circuits.

6. An apparatus for identifying a range of different integrated circuits comprising:
a plurality of packages, each package for mounting a respective one of the integrated circuits therein;
a plurality of sets of identifying electrical nodes, each set of nodes being coupled with a respective one of the packages;
means for grouping each set of nodes into disjoint subsets so that at least one of the sets of nodes is grouped into at least three disjoint subsets; and
electrical coupling means for identifying the range of different integrated circuits, said electrical coupling means comprising a plurality of circuit pathways wherein each circuit pathway electrically interconnects the nodes of a respective one of the disjoint subsets.

7. An apparatus as in claim 6 wherein:
each set of identifying electrical nodes consists of a respective five identifying electrical nodes; and
the electrical coupling means for identifying the range of different integrated circuits includes an electrical coupling means for identifying a range of fifty two different integrated circuits.

8. An apparatus as in claim 6 wherein:
each set of identifying electrical nodes consists of a respective six identifying electrical nodes; and
the electrical coupling means for identifying the range of different integrated circuits includes an electrical coupling means for identifying a range of two hundred and three different integrated circuits.

9. An apparatus as in claim 6 wherein:
each set of identifying electrical nodes consists of a respective seven identifying electrical nodes; and
the electrical coupling means for identifying the range of different integrated circuits includes an electrical coupling means for identifying a range of eight hundred and seventy seven different integrated circuits.

10. An apparatus as in claim 6 wherein:
each set of identifying electrical nodes consists of a respective eight identifying electrical nodes; and
the electrical coupling means for identifying the range of different integrated circuits includes an electrical coupling means for identifying a range of four thousand one hundred and forty different integrated circuits.

11. An apparatus as in claim 6 wherein a number of members in each set of nodes is within a range of five to eight node members.

12. An apparatus as in claim 6 wherein a number of members in each set of nodes is six node members.

* * * * *